United States Patent
Quad et al.

(10) Patent No.: US 8,921,792 B2
(45) Date of Patent: Dec. 30, 2014

(54) VERTICALLY STACKED THERMOPILE

(75) Inventors: Reiner Quad, Beaconsfield (CA);
Arthur Barlow, Alton (GB); Yuan Hsi Chan, Pierrefonds (CA); Michael Ersoni, Saint-Laurent (CA); Hermann Karagozoglu, Wiesbaden (DE); Radu M. Marinescu, Pointe-Claire (CA)

(73) Assignee: Excelitas Technologies Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/640,865

(22) PCT Filed: Mar. 17, 2011

(86) PCT No.: PCT/CA2011/000289
§ 371 (c)(1),
(2), (4) Date: Oct. 12, 2012

(87) PCT Pub. No.: WO2011/127556
PCT Pub. Date: Oct. 20, 2011

(65) Prior Publication Data
US 2013/0026366 A1 Jan. 31, 2013

Related U.S. Application Data

(60) Provisional application No. 61/324,221, filed on Apr. 14, 2010.

(51) Int. Cl.
*H01L 27/14* (2006.01)
*G01J 5/14* (2006.01)
*G01J 5/02* (2006.01)
*G01J 5/12* (2006.01)

(52) U.S. Cl.
CPC .............. *G01J 5/14* (2013.01); *G01J 5/0225* (2013.01); *G01J 5/12* (2013.01)
USPC .................................................... 250/338.4

(58) Field of Classification Search
USPC ..................................................... 250/338.4
See application file for complete search history.

(56) References Cited

U.S. PATENT DOCUMENTS

| | | | |
|---|---|---|---|
| 3,339,002 A | 8/1967 | Pelanne | |
| 4,032,363 A | 6/1977 | Raag | |
| 5,982,014 A | 11/1999 | Paige et al. | |
| 6,100,463 A | 8/2000 | Ladd et al. | |
| 2005/0183763 A1* | 8/2005 | Christiansen | 136/224 |
| 2006/0169902 A1 | 8/2006 | Watanabe | |

* cited by examiner

*Primary Examiner* — David Porta
*Assistant Examiner* — Djura Malevic
(74) *Attorney, Agent, or Firm* — Peter A. Nieves; Sheehan Phinney Bass + Green PA

(57) ABSTRACT

A vertically stacked thermopile and an IR sensor using said stacked thermopiles are provided. The vertically stacked thermopile may include multiple thermocouples stacked vertically on one another. The thermocouples may be connected in series, parallel, or a combination of series and parallel. One or more vertically stacked thermopiles may be included in an IR sensor and the thermopiles may be connected in series, parallel, or a combination of series and parallel.

5 Claims, 11 Drawing Sheets

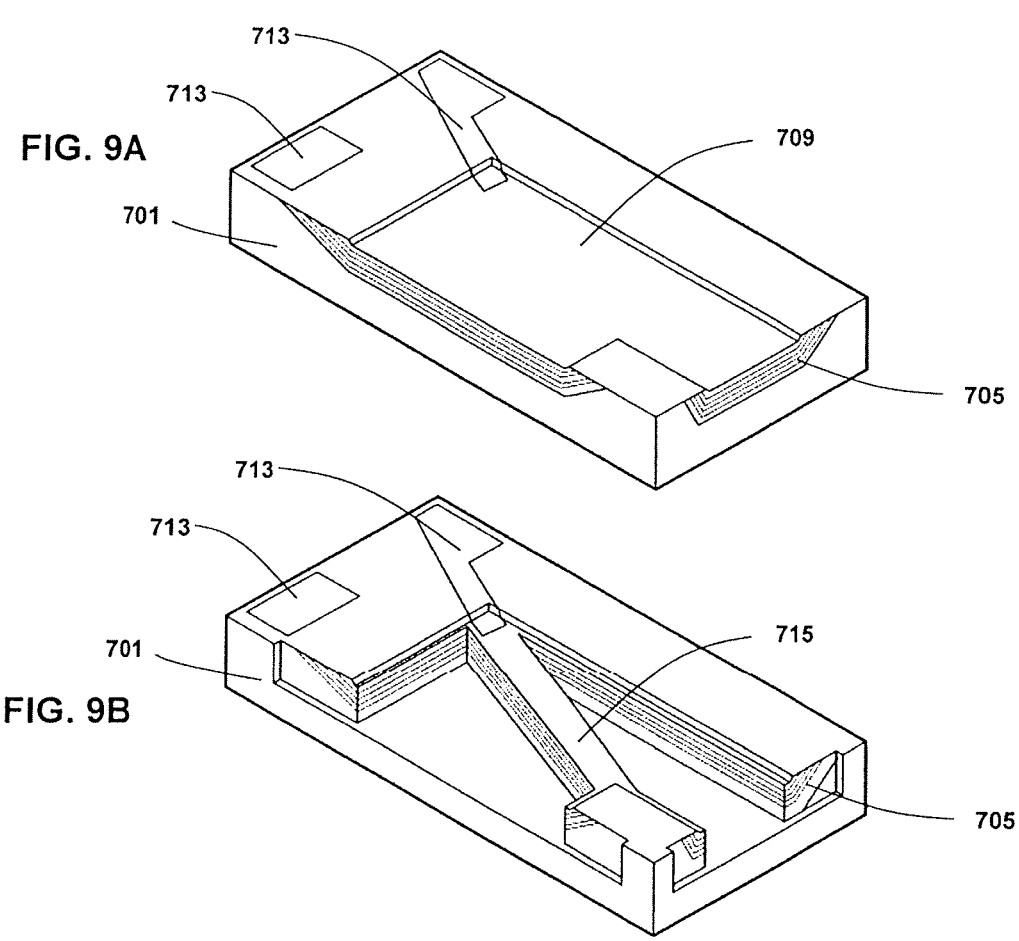

VERTICALLY STACKED THERMOPILE

FIELD

The present disclosure relates generally to thermopiles, and more particularly, to vertically stacked thermopiles.

RELATED ART

A thermopile is an infrared radiation (IR) detector commonly used for making non-contact temperature measurements. For example, thermopiles are used in ear thermometers, proximity sensors, heat flux sensors, and the like. Thermopiles are made up of a series of electrically connected thermocouple pairs, each pair made up of dissimilar conducting or semi-conducting materials with different Seebeck coefficients. For example, N-type poly-silicon and P-type poly-silicon are often used in conventional thermopiles.

Generally, one end of each thermocouple is placed in contact with a membrane operable to collect IR energy, while the other end is placed on a supporting substrate. The collected IR energy creates a temperature gradient across the thermocouple, causing the thermocouple to generate an output voltage via the Seebeck effect. For a thermocouple having known characteristics, the output voltage may be converted into a temperature value.

Since the output voltage of a thermocouple is relatively small, generally in the range of a few microvolts, the output voltage must be amplified prior to being converted into a temperature value. However, amplification may introduce a margin of error into the measurement result. Thus, to reduce the amount of error introduced, a larger output voltage may be desired since a larger voltage requires less amplification. To accomplish this, some thermopiles include multiple thermocouples connected in series to generate a larger output voltage.

Conventionally, when multiple thermocouples are connected together, the thermocouples are arranged side-by-side on the semiconductor substrate. However, one drawback of this configuration is that the space required to fit the thermocouples can be quite large. Thus, in applications requiring a small device, placing the thermocouples in a side-by-side configuration may be undesirable.

Thus, a compact thermopile sensor capable of producing precise measurements is desired.

BRIEF SUMMARY

A vertically stacked thermopile for monitoring radiation is disclosed. The vertically stacked thermopile may include a multilayer stack including a plurality of vertically ascending planar layers alternating between first and second layers, said first layers being formed from a material having a positive seebeck coefficient and said second layers being formed from a material having a negative seebeck coefficient, said stack further including insulating layers between said first and second layers; first electrical connectors formed along a first side edge of the stack, said first connectors extending from a first layer to a second layer in the vertically upward direction; and second electrical connectors formed along a second side edge of the stack, said second connectors extending from a second layer to a first layer in the vertically upward direction, said first and second electrical connectors in combination creating a series connection between the first and second layers in the stack and wherein one side edge of the stack defines the hot end of the stack and the other side edge of the stack defines the cold end of the stack such that when the hot end of the stack is exposed to radiation and the voltage generated across the connectors on the cold end of the stack will correspond to the amount of radiation exposure at the hot end of the stack.

In one example, the first and second side edges are aligned in a vertical array. In another example, the first and second side edges are aligned in a horizontal array. In yet another example, the first and second side edges are aligned in array and positioned at an angle offset from the vertical. In one example, the angle offset from the vertical ranges from 10 degrees to 60 degrees. In one example, the plurality of vertically ascending planar layers may include ten or more first layers and ten or more second layers A sensor including one or more vertically stacked thermopiles is disclosed. The sensor may include a semiconductor substrate, wherein a cavity is formed within the semiconductor substrate; a vertically stacked thermopile formed on the semiconductor substrate, the vertically stacked thermopile including: a plurality of vertically ascending planar layers alternating between first and second layers, said first layers being formed from a material having a positive seebeck coefficient and said second layers being formed from a material having a negative seebeck coefficient, said stack further including insulating layers between said first and second layers; and a plurality of metal contacts creating a series connection between the plurality of vertically ascending planar layers; and an absorber membrane positioned above the cavity, wherein a first portion of the vertically stacked thermopile is in contact with the absorber membrane, and wherein the vertically stacked thermopile is operable to generate a voltage in response to receiving radiation from the absorber membrane, the voltage corresponding to the amount of received radiation.

In one example, the sensor may include a plurality of vertically stacked thermopiles formed on the semiconductor substrate. The plurality of vertically stacked thermopiles may be connected in series, parallel, or a combination of series and parallel. The plurality of vertically stacked thermopiles may further be arranged in a formation such as a cross formation, square formation, and a star formation. In one example, the plurality of vertically ascending planar layers may include ten or more first layers and ten or more second layers. In one example, an array of sensors may include a plurality of sensors formed on a single semiconductor substrate.

A method for manufacturing a vertically stacked thermopile is disclosed. The method may include providing a semiconductor substrate; etching a first cavity in the semiconductor substrate; depositing, in the first cavity, a plurality of vertically ascending planar layers alternating between first and second layers, said first layers being formed from a material having a positive seebeck coefficient and said second layers being formed from a material having a negative seebeck coefficient, said stack further including insulating layers between said first and second layers; depositing a first plurality of metal contacts creating a series connection between the first and second layers; depositing a nitride layer over the plurality of vertically ascending planar layers and the first plurality of metal contacts, wherein at least a portion of the first plurality of metal layers is not covered by the nitride layer; depositing a second plurality of metal contacts on the nitride layer, wherein at least a portion of the second plurality of metal contacts connects to the at least a portion of the first plurality of metal layers that is not covered by the nitride layer; etching a portion of the nitride layer, plurality of vertically ascending planar layers, and insulating layers to form a thermopile strip; depositing a passivating nitride layer on the second plurality of metal contacts, the nitride layer, and the thermopile strip, wherein at least a portion of the second plurality of metal contacts is not covered by the passivating nitride layer; depositing an absorptive material on at least a portion of the semiconductor substrate and at least a portion of the thermopile strip; and etching a second cavity in the semiconductor substrate, wherein the second cavity is positioned below the absorptive material and at least a portion of the thermopile strip.

In one example, each of plurality of vertically ascending planar layers may have a thickness ranging from 0.05-0.1 microns. In another example, the thermopile strip may have a length ranging from 10-100 microns. In yet another example, the plurality of vertically ascending planar layers may include ten or more first layers and ten or more second layers.

BRIEF DESCRIPTION OF THE DRAWINGS

FIGS. 7A-7B, 8A-8B, 9A-9B, 10A-10B, and 11 illustrate a process for making an exemplary sensor having multiple vertically stacked thermopiles.

DETAILED DESCRIPTION

The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

Various embodiments are described below relating to vertically stacked thermopiles and IR sensors using said vertically stacked thermopiles. In particular, the vertically stacked thermopiles may contain multiple thermocouples for obtaining a higher output voltage and improved overall sensor performance compared to conventional thermopile sensors. Further, the vertically stacked thermopiles may occupy a smaller lateral area on the sensor's semiconductor substrate by stacking the thermocouples vertically above one another. In this way, multiple thermocouples can be placed in the same sensor area as a single thermocouple, allowing smaller sensor size. Such a configuration may be beneficial when the sensor area and size are limited, for example, in a thermopile imaging device having many such sensors placed in close proximity to form a pixelated image sensor. Additionally, the thermocouples may be connected in series, parallel, or a combination of series and parallel.

Figure 1:
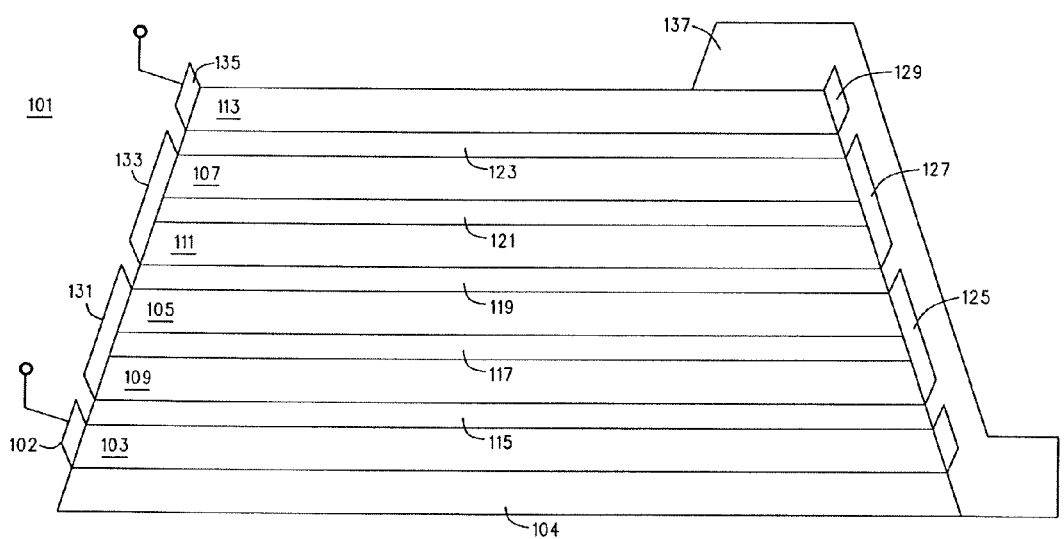
FIG. 1 illustrates a cross-sectional view of an exemplary vertically stacked thermopile.

FIG. 1 illustrates a cross-sectional view of exemplary stacked thermopile 101. Stacked thermopile 101 may include support membrane 104 for providing mechanical support for stacked thermopile 101. Further, support membrane 104 may be made of a material having a low thermal conductivity, such as silicon nitride, silicon dioxide, organic plastic, or the like. Selecting such a material limits the amount of heat conducted by support membrane 104 from one end of stacked thermopile 101 to the other.

Stacked thermopile 101 may further include one or more thermocouple pairs, each pair made up of thermoelectric layers having different Seebeck coefficients. For example, the thermoelectric layers may be made of dissimilar conducting or semi-conducting materials such as N-type poly-silicon and P-type poly-silicon. These thermoelectric layers may be stacked vertically in an alternating fashion and separated by insulating layers. In the illustrated embodiment, lasers 103, 105 and 107 represent the N-type poly-silicon material and layers 109 111 and 113 represent the P-type poly-silicon material. The insulating layers (e.g., insulating layers 115, 117, 119, 121, and 123) may be made of any dielectric material, such as poly-oxide, silicon dioxide, or the like.

In one example, stacked thermopile 101 may include three thermocouple pairs. The first thermocouple pair may be made up of N-Poly layer 103 formed vertically above support membrane 104, insulating layer 115 formed vertically above N-Poly layer 103, and P-Poly layer 109 formed vertically above insulating layer 115. The first thermocouple pair may further include metal contact 125 for electrically coupling N-Poly layer 103 to P-Poly layer 109. Metal contact 125 may be formed of any electrically conducting metal, such as aluminum, gold, or the like.

Stacked thermopile 101 may further include insulating layer 117 formed vertically above the first thermocouple pair. The second thermocouple pair may be formed vertically above insulating layer 117. The second thermocouple pair may be made up of N-Poly layer 105 formed vertically above insulating layer 117, insulating layer 119 formed vertically above N-Poly layer 105, and P-Poly layer 111 formed vertically above insulating layer 119. The second thermocouple pair may further include metal contact 127 for electrically coupling N-Poly layer 105 to P-Poly layer 111. Metal contact 127 may be made of the same or a similar material as metal contact 125.

Stacked thermopile 101 may further include metal contact 131 for electrically coupling the first thermocouple pair in series with the second thermocouple pair. Metal contact 131 may be made of the same or a similar material as metal contact 125. By configuring the thermocouple pairs in series, stacked thermopile 101 may generate an output voltage having a larger magnitude than a thermopile having a single thermocouple pair or multiple thermocouple pairs connected in parallel. As discussed above, a larger voltage may result in a more accurate temperature measurement.

Stacked thermopile 101 may further include insulating layer 121 formed vertically above the second thermocouple pair. The third thermocouple pair may be formed vertically above insulating layer 121. The third thermocouple pair may be made up of N-Poly layer 107 formed vertically above insulating layer 121, insulating layer 123 formed vertically above N-Poly layer 107, and P-Poly layer 113 formed vertically above insulating layer 123. The third thermocouple pair may further include metal contact 129 for electrically coupling N-Poly layer 107 to P-Poly layer 113. Metal contact 129 may be made of the same or a similar material as metal contact 125.

Stacked thermopile 101 may further include metal contact 133 for electrically coupling the second thermocouple pair in series with the third thermocouple pair. Metal contact 133 may be made of the same or a similar material as metal contact 125. By configuring the thermocouple pairs in series, stacked thermopile 101 may generate an output voltage having a larger magnitude than a thermopile having a single thermocouple pair or multiple thermocouple pairs connected in parallel. As discussed above, a larger voltage may result in a more accurate temperature measurement.

In one example, metal contacts 125, 127, and 129 may be configured to contact absorber 137. Absorber 137 may be configured to absorb IR radiation and may be made of any thermally absorptive material, such as carbon-black, black-gold, other compounds or organic compounds or mixtures, or the like. Metal contacts 125, 127, and 129 may transfer heat from absorber 137 to the poly layers of thermopile 101. The side of thermopile 101 in contact with absorber 137 will be referred to herein as the "hot junction." The side of thermopile 101 opposite the "hot junction" will be referred to herein as the "cold junction."

Stacked thermopile 101 may further include measurement contacts 102 and 135 for measuring a voltage drop across all thermocouple pairs. Measurement contacts 102 and 135 may be made of the same or a similar material as metal contact 125. In one example, measurement contact 102 may be placed on the cold junction end of N-Poly layer 103 and measurement contact 135 may be placed on the cold junction end of P-Poly layer 113. Thus, measurement contacts 102 and 135 may be positioned on either end of the series-connected thermocouple pairs. Therefore, the voltage across measurement contacts 102 and 135 represents the combined voltage across the three thermocouple pairs (N-Poly layers 103, 105, and 107 and P-Poly layers 109, 111, and 113).

In one example, the N-Poly layers, P-Poly layers, and insulating layers may have a thickness ranging from 0.05 to 0.5 microns. Further, the lengths of each layer may range from 10-100 microns. However, it should be appreciated by one of ordinary skill that layers having any thickness or length may be used.

In one example, the thermocouple pairs of thermopile 101 may instead be connected in parallel or may be connected in a combination of series and parallel. In another example, multiple stacked thermopiles 101 may be connected together in series, parallel, or a combination of series and parallel.

While stacked thermopile 101 is shown having three thermocouple pairs, one of ordinary skill will appreciate that any number of thermocouple pairs may be stacked vertically and added to stacked thermopile 101 in the manner described above. For instance, in one example, thermopile 101 may include ten or more thermocouple pairs.

Figure 2:
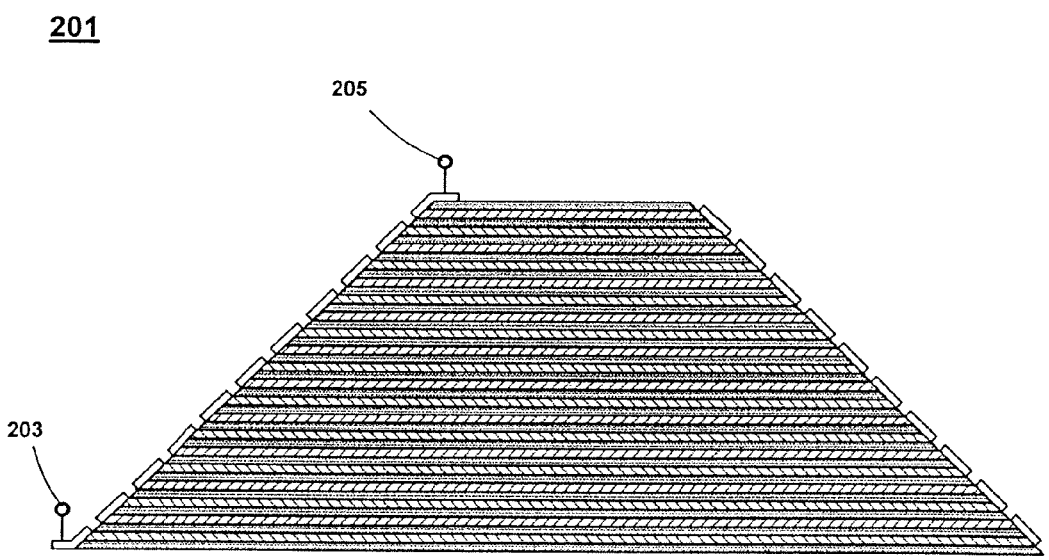
FIG. 2 illustrates a cross-sectional view of another exemplary vertically stacked thermopile.
Figure 3:
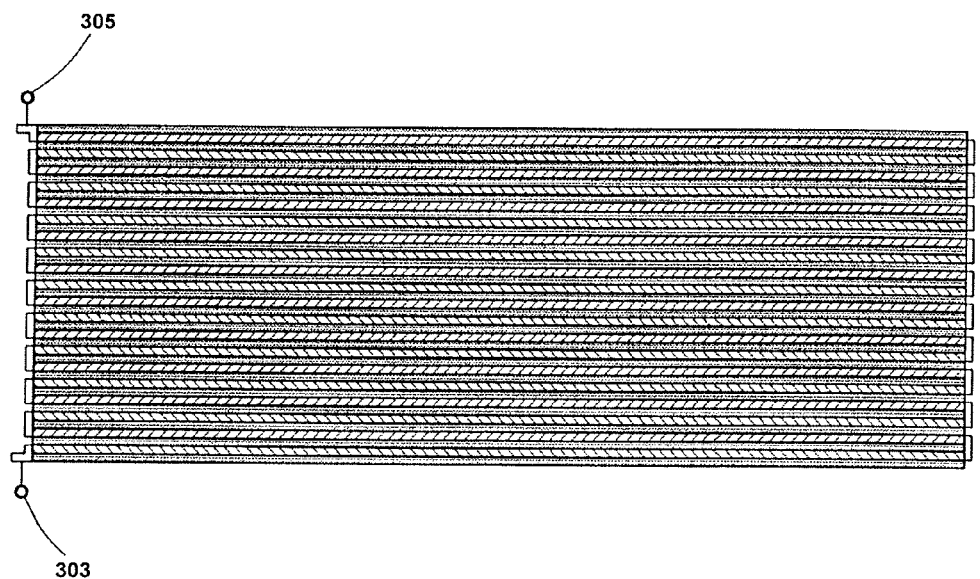
FIG. 3 illustrates a cross-sectional view of another exemplary vertically stacked thermopile.
Figure 4:
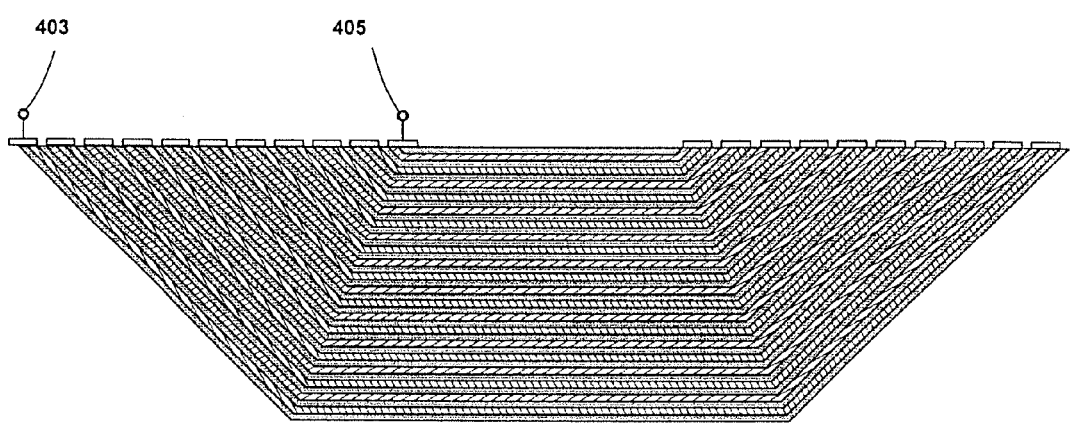
FIG. 4 illustrates a cross-sectional view of another exemplary vertically stacked thermopile.

FIGS. 2-4 illustrate other exemplary stacked thermopiles having differently configured side surfaces. The shaded regions represent insulation layers, the forward slashed regions represent material having a positive Seebeck coefficient, and the backward slashed regions represent material having a negative Seebeck coefficient. FIG. 2 illustrates exemplary stacked thermopile 201 (similar to stacked thermopile 101) having sloped side surfaces. By sloping the sides of stacked thermopile 201, the surface area of the exposed side surfaces of each poly layer is increased. The increased surface area provides a larger application target for the metal contacts. Stacked thermopile 201 may include measurement contacts 203 and 205 positioned on the cold junction end of thermopile 201.

In one example, the angle of the side portions of stacked thermopile 201 may depend at least in part on the manufacturing resolution of the placement of the metal contacts. For instance, if the metal contacts may be placed on the side portions of stacked thermopile 201 with high precision (i.e., with small deviation in the placement), a large angle may be selected, thereby creating steeper edges and a smaller surface area for the side portions of stacked thermopile 201. However, if there is a large deviation in the placement of the metal contacts on the side portions of stacked thermopile 201, a smaller angle may be selected, thereby creating more gradual edges and a larger surface area for the side portions of stacked thermopile 201. In some examples, the angle may range from 30-80 degrees from horizontal. Further, in some examples, the length of the layers of stacked thermopile 201 may range from 10-100 microns and the thickness of each layer of stacked thermopile 201 may range from 0.05-0.1 microns. However, it should be appreciated by one of ordinary skill that layers having any length and thickness may be used.

FIG. 3 illustrates another exemplary stacked thermopile 301 having vertical side surfaces. Unlike in thermopile 201, where the thermoelectric layers near the top of the stack are shorter than the thermoelectric layers near the bottom of the stack, each layer of stacked thermopile 301 may have the same, or at a least similar, length. Thus, any number of thermocouple pairs may be stacked since the number of thermocouple pairs are not limited by the diminishing length of thermoelectric layers as is the case in stacked thermopile 201. Stacked thermopile 301 may include measurement contacts 303 and 305 positioned on the cold junction end of thermopile 301.

FIG. 4 illustrates another exemplary stacked thermopile 401 having horizontal side surfaces. In this example, the layers of stacked thermopile 401 may be formed in a valley etched into a silicon substrate. The edges of the valley may be etched to create a desired angle for the side portions of stacked thermopile 401. Since the side portions of stacked thermopile 401 are at an angle, the surface area of the exposed side surface of each poly layer is increased. However, unlike stacked thermopile 201, the metal contacts of stacked thermopile 401 may be placed on a horizontal surface rather than on an angled surface. Stacked thermopile 401 may include measurement contacts 403 and 405 positioned on the cold junction end of thermopile 401.

In one example, the etching angle of the valley in the silicon substrate may depend at least in part on the manufacturing resolution of the placement of the metal contacts. For instance, if the metal contacts may be placed on the side portions of stacked thermopile 401 with high precision (i.e., with small deviation in the placement), a large etching angle may be selected, thereby creating steeper edges and a smaller surface area for the side portions of stacked thermopile 401. However, if there is a large deviation in the placement of the metal contacts on the side portions of stacked thermopile 401, a smaller etching angle may be selected, thereby creating more gradual edges and a larger surface area for the side portions of stacked thermopile 401. In some examples, the angle of the edges of the valley may range from 30-80 degrees from horizontal. Further, in some examples, the length of the layers of stacked thermopile 401 may range from 10-100 microns and the thickness of each layer of stacked thermopile 401 may range from 0.01-0.1 microns. However, it should be appreciated by one of ordinary skill that layers having any length and thickness may be used.

Figure 5:
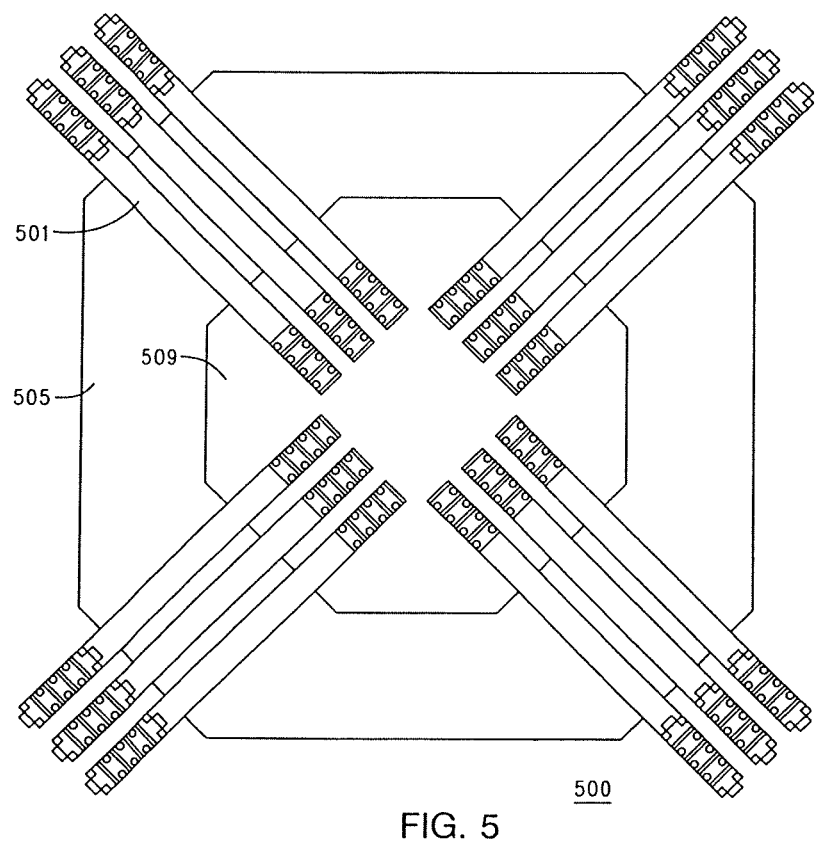
FIG. 5 illustrates an overhead view of an exemplary sensor having multiple vertically stacked thermopiles.

FIG. 5 illustrates an overhead view of an exemplary sensor 500 for detecting IR, the sensor having multiple stacked thermopiles 501. Sensor 500 may include absorber 509 for absorbing IR radiation. Absorber 509 may be made of any thermally absorptive material, such as carbon-black, black-gold, other compounds or organic compounds or mixtures, or the like. Absorber 509 may be suspended over cavity 505 to provide at least partial thermal insulation for absorber 509. Sensor 500 may further include one or more stacked thermopiles 501 for measuring a temperature difference between absorber 509 and a reference temperature. Stacked thermopiles 501 may be any of the exemplary thermopiles described above with respect to FIGS. 1-4. Sensor 500 may measure the temperature of absorber 509 based on the reference temperature and the temperature measured by the one or more stacked thermopiles 501.

In one example, two or more of the stacked thermopiles 501 may be coupled together. Stacked thermopiles 501 may be connected in series, parallel, or a combination of series and parallel. Additionally, while 12 stacked thermopiles 501 are shown, one of ordinary skill will appreciate that any number of stacked thermopiles 501 may be included in sensor 500.

Figure 6:
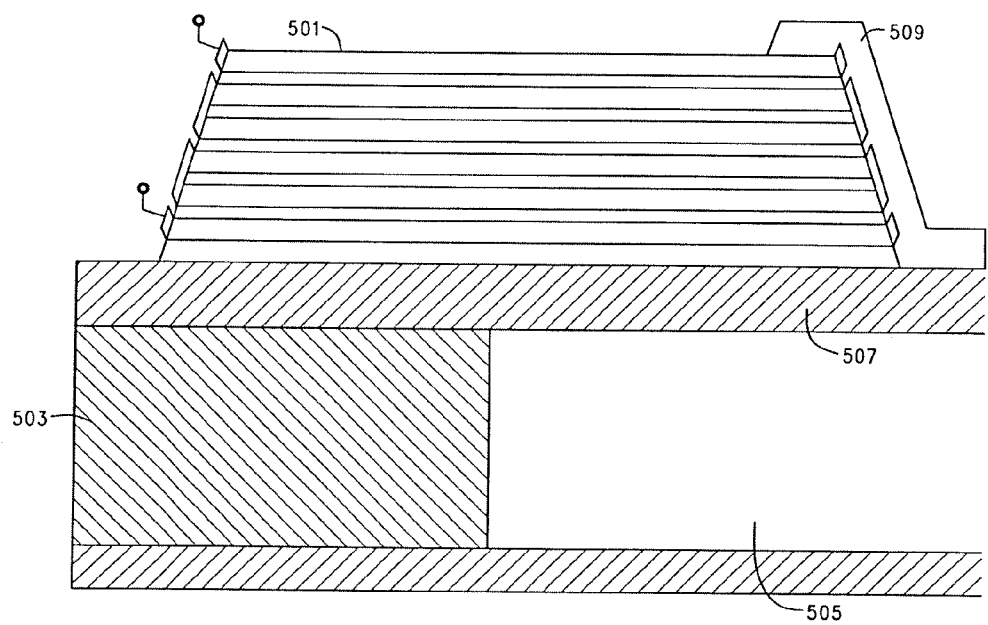
FIG. 6 illustrates a cross-sectional view of an exemplary sensor having multiple vertically stacked thermopiles.

FIG. 6 illustrates a cross-sectional view of sensor 500 viewed along the length of one of the stacked thermopiles 501. As shown in FIG. 6, stacked thermopile 501 may be formed on substrate 503 and membrane 507. Substrate 503 may be a silicon substrate commonly used in semiconductor devices. Stacked thermopile sensor 500 may include membrane 507, formed on substrate 503, for providing mechanical support for stacked thermopile 501 after a portion of substrate 503 below stacked thermopile 501 is etched away. Membrane 507 may be made of a material having a low thermal conductivity, such as silicon nitride, silicon dioxide, organic plastic, or the like. Selecting such a material limits the amount of heat conducted by membrane 507 from one end of stacked thermopile 501 to the other. In one example, absorber 509 may be placed on membrane 507 and may overlap at least a portion of stacked thermopile 501 as discussed above with respect to FIG. 1. In one example, cavity 505 may be formed in substrate 503 below both absorber 509 and at least a portion of stacked thermopile 501. Cavity 505 may provide at least partial thermal insulation for absorber 509. Cavity 505 may be formed using any known etching method, for example, anisotropic etching.

In one example, stacked thermopiles 501 may have a length ranging from 10-100 microns, a width ranging from 1-5 microns, and a total thickness ranging from 0.5-2 microns. However, it should be appreciated that stacked thermopiles 501 may have any length, width, or thickness depending on the desired application.

Additionally, while 12 stacked thermopiles 501 are shown in a "cross" configuration in FIG. 5, it should be appreciated that any number of stacked thermopiles 501 having any number of thermocouple layers may be used in sensor 500 and may be placed in any configuration. For example, stacked thermopiles 501 may be placed evenly around absorber 509 and may extend radially outward from absorber 509. In other examples, stacked thermopiles 501 may form a star, square, or the like.

Sensor 500 may be used in many different applications, such as proximity detectors, thermometers, security detectors, surveillance, and the like. For instance, multiple sensors 500 may be configured in a grid, where each sensor 500 represents a pixel of an image. The outputs of sensors 500 may be used to generate a heat image of an object being viewed. This may be used to screen passengers boarding an airplane, monitor a room for the presence of a warm body, etc. In one example, the multiple sensors 500 may be formed on the same semiconductor substrate.

Figure 7A:
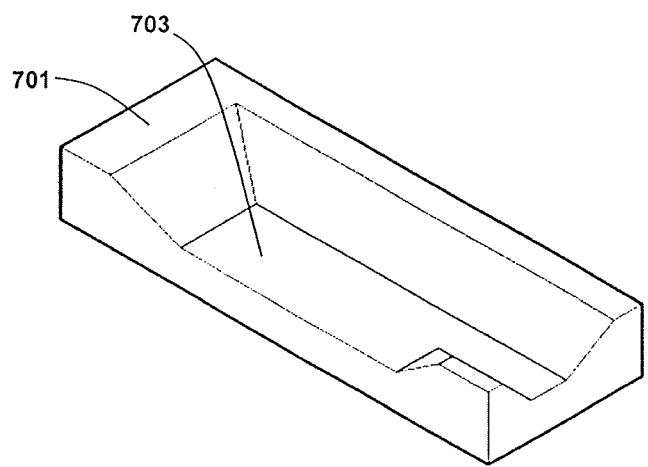
Figure 7B:
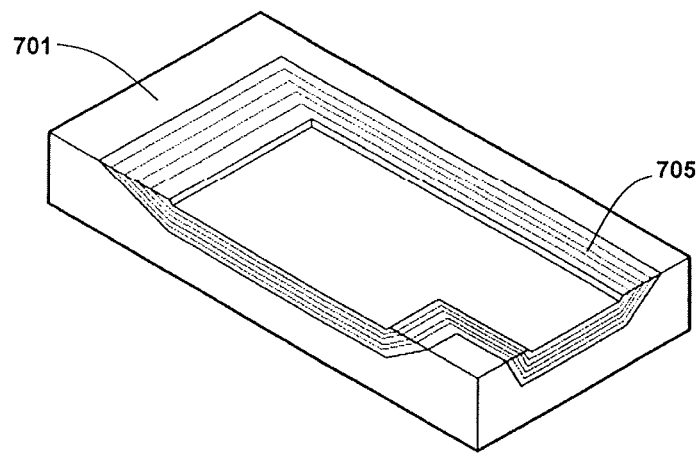
Figure 8A:
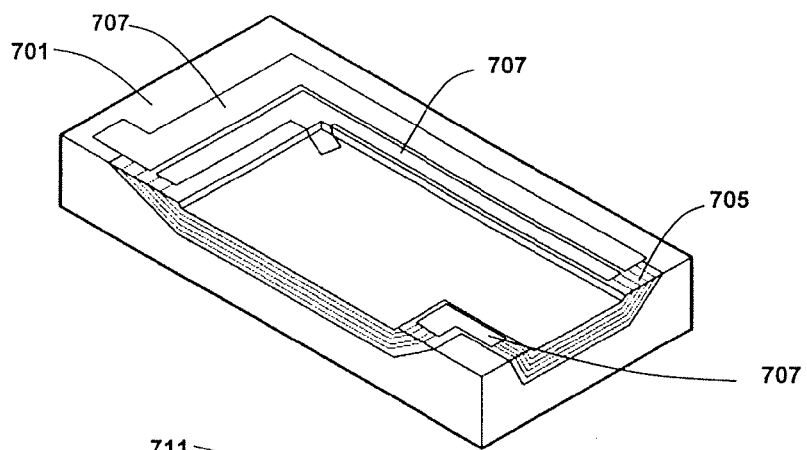
Figure 8B:
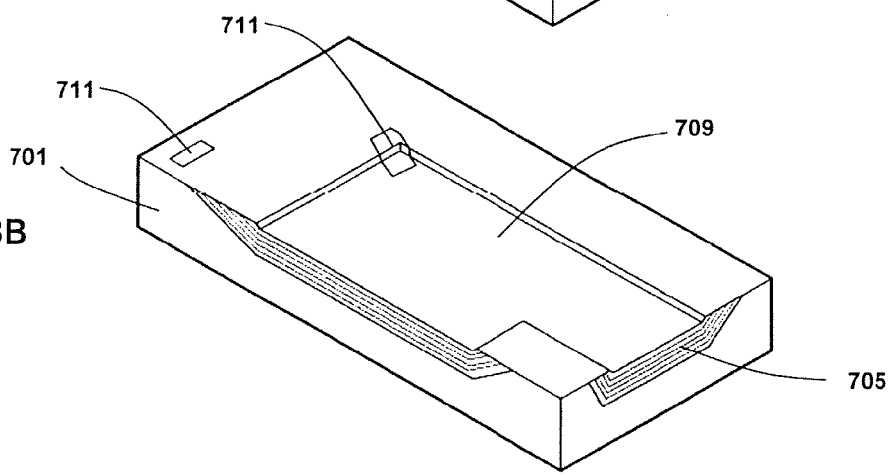
Figure 10A:
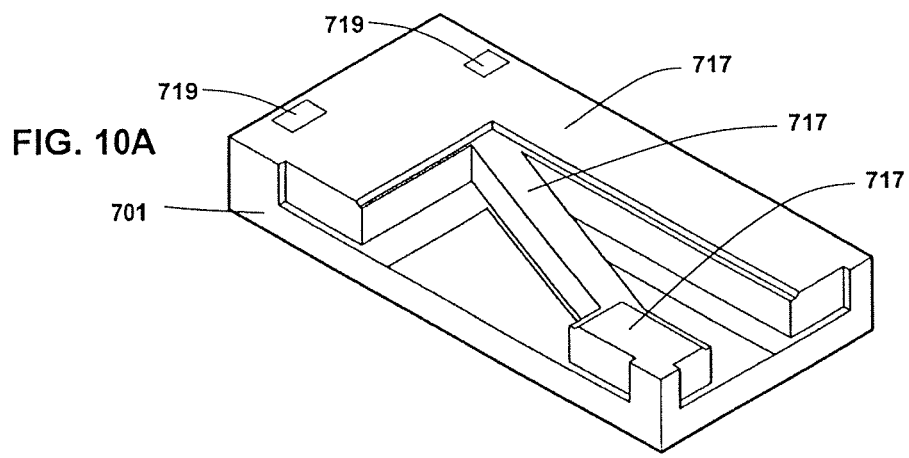
Figure 10B:
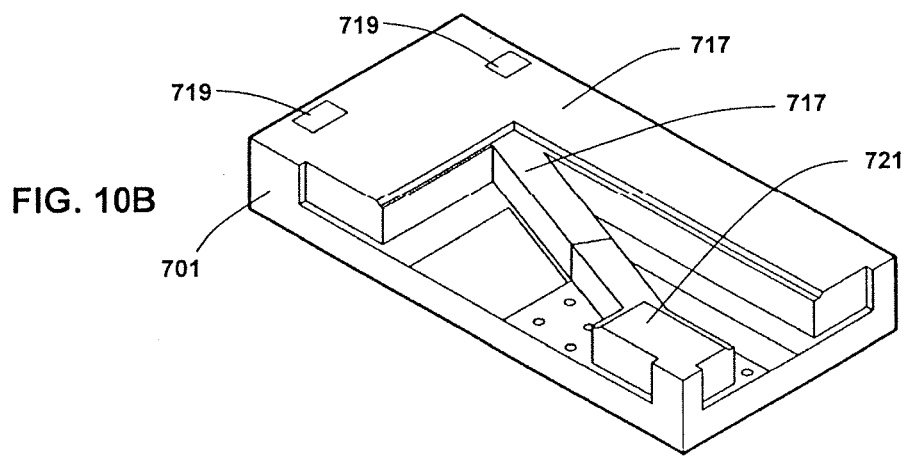
Figure 11:
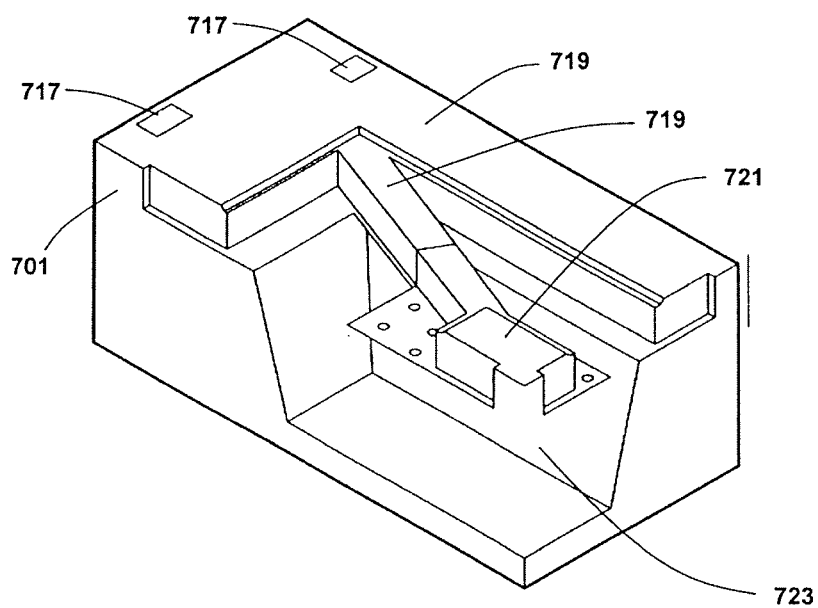

FIGS. 7A-7B, 8A-8B, 9A-9B, 10A-10B, and 11 illustrate an exemplary process for making sensor 500. In particular, FIGS. 7A-7B, 8A-8B, 9A-9B, 10A-10B, and 11 illustrate one quadrant of sensor 500 shown in FIG. 5 through the various stages of manufacture. FIG. 7A illustrates the first step of the process where a portion of silicon substrate 701 is etched away to create valley 703 for forming the stacked thermopiles. FIG. 7B illustrates the next step of the process where a plurality of poly-silicon layers and insulation layers 705 are deposited in valley 703. The plurality of poly-silicon layers and insulation layers 705 may be stacked as discussed above with respect to FIG. 1. FIG. 8A illustrates the next step of the process where metal contacts 707 are deposited to connect the poly-silicon layers as desired. For example, metal contacts 707 may be placed to configure the thermocouple pairs in series in a configuration similar to that illustrated by FIG. 4. FIG. 8B illustrates the next step of the process where an insulating nitride layer 709 is deposited on the top surface of silicon substrate 701 and poly-silicon layers and insulation layers 705. Windows 711 may be patterned into nitride layer 709 to allow contact with metal contacts 707 and the thermopile stack underneath. FIG. 9A illustrates the next step of the process where a second metal layer 713 is deposited on nitride layer 709 and positioned above windows 711 to contact the terminal points of the thermopile underneath. FIG. 9B illustrates the next step of the process where the material laid down in FIGS. 7A-7B, 8A-8B, and 9A is etched away to form stacked thermopile strips 715. FIG. 10A illustrates the next step of the process where the entire surface is coated with a passivating nitride layer 717, in which windows 719 are opened for contact vias as well as the regions where the substrate will be chemically etched in order to release the thermopile. Windows 719 may act as measurement contacts similar to measurement contacts 403 and 405 of FIG. 4. FIG. 10B illustrates the next step of the process where the a portion of thermopile strip 715 and silicon substrate 701 is coated with a heat absorptive material 721, such as carbon-black, black-gold, other compounds or organic compounds or mixtures, or the like, for increasing the amount of heat absorbed and transferred to thermopile strip 715. FIG. 11 illustrates the next step of the process where a cavity 723 is etched into substrate 701 below the absorptive material 721 and below at least a portion of stacked thermopile strip 715. Cavity 723 may be created to improve thermal insulation of absorptive material 721.

Various configurations of a vertically stacked thermopile and a sensor having vertically stacked thermopiles are provided in the examples above. As will be apparent to one of ordinary skill in the art, other configurations are possible so long as the thermoelectric layers are stacked vertically above each other.

Although a feature may appear to be described in connection with a particular embodiment, one skilled in the art would recognize that various features of the described embodiments may be combined. Moreover, aspects described in connection with an embodiment may stand alone.

What is claimed is:
1. A method for manufacturing a vertically stacked thermopile comprising:
   providing a semiconductor substrate;
   etching a first cavity in the semiconductor substrate;
   depositing, in the first cavity, a plurality of vertically ascending planar layers alternating between first and second layers, said first layers being formed from a semiconductor material having a positive seebeck coefficient and said second layers being formed from a semiconductor material having a negative seebeck coefficient, said stack further including a plurality of insulating layers between said first and second layers;
   depositing a first plurality of metal contacts creating a series connection between the first and second semiconductor layers, at least one of said plurality of metal contacts extending from the first layer to the second layer in the vertically upward direction;

depositing a first insulation layer over the plurality of vertically ascending planar layers and the first plurality of metal contacts, wherein at least a portion of the first plurality of metal layers is not covered by the first insulation layer;

depositing a second plurality of metal contacts on the first insulation layer, wherein at least a portion of the second plurality of metal contacts connects to the at least a portion of the first plurality of metal layers that is not covered by the first insulation layer;

etching a portion of the first insulation layer, a portion of the plurality of vertically ascending planar layers, and a portion of the plurality of insulating layers to form a thermopile strip;

depositing a second insulation layer on the second plurality of metal contacts, the first insulation layer, and the thermopile strip, wherein at least a portion of the second plurality of metal contacts is not covered by the second insulation layer;

depositing an absorptive material on at least a portion of the semiconductor substrate and at least a portion of the thermopile strip; and etching a second cavity in the semiconductor substrate, wherein the second cavity is positioned below the absorptive material and at least a portion of the thermopile strip.

2. The method of claim 1, wherein each of plurality of vertically ascending planar layers has a thickness ranging from 0.05-0.1 microns.

3. The method. of claim 1, wherein the thermopile strip has a length ranging from 10-100 microns.

4. The method of claim 1, wherein the plurality of vertically ascending planar layers includes ten or more first layers and ten or more second layers.

5. The method of claim 1, wherein the first insulation layer and second insulation layer are nitride layers.

* * * * *